(12) United States Patent
Klersy

(10) Patent No.: US 8,089,059 B2
(45) Date of Patent: Jan. 3, 2012

(54) PROGRAMMABLE RESISTANCE MEMORY ELEMENT

(75) Inventor: Patrick Klersy, Lake Orion, MI (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 12/944,312

(22) Filed: Nov. 11, 2010

(65) Prior Publication Data
US 2011/0114911 A1 May 19, 2011

Related U.S. Application Data

(60) Continuation of application No. 12/069,046, filed on Feb. 7, 2008, now Pat. No. 7,833,823, which is a division of application No. 10/269,048, filed on Oct. 10, 2002, now abandoned, which is a continuation-in-part of application No. 09/276,273, filed on Mar. 25, 1999, now Pat. No. 6,969,866, which is a continuation-in-part of application No. 08/942,000, filed on Oct. 1, 1997, now abandoned.

(51) Int. Cl.
H01L 45/00 (2006.01)

(52) U.S. Cl. .................................. 257/2; 257/E45.002
(58) Field of Classification Search .............. 257/2, 4, 257/E45.002, 536
See application file for complete search history.

(56) References Cited

U.S. PATENT DOCUMENTS

| | | | |
|---|---|---|---|
| 5,359,205 A * | 10/1994 | Ovshinsky | 257/3 |
| 5,998,244 A | 12/1999 | Wolstenholme et al. | |
| 6,031,287 A | 2/2000 | Harshfield | |
| 6,194,746 B1 | 2/2001 | Gonzalez et al. | |
| 6,420,725 B1 | 7/2002 | Harshfield | |
| 2002/0090742 A1* | 7/2002 | Maruyama et al. | 438/3 |
| 2003/0073252 A1* | 4/2003 | Park et al. | 438/3 |
| 2003/0090930 A1* | 5/2003 | Rizzo | 365/158 |

* cited by examiner

*Primary Examiner* — Thao P. Le
(74) *Attorney, Agent, or Firm* — Kevin L. Bray

(57) ABSTRACT

A programmable resistance memory element. The active volume of memory material is made small by the presence of a small area of contact between the conductive material and the memory material. The area of contact is created by forming a region of conductive material and an intersecting sidewall layer of the memory material. The region of conductive material is preferably a sidewall layer of conductive material.

27 Claims, 8 Drawing Sheets

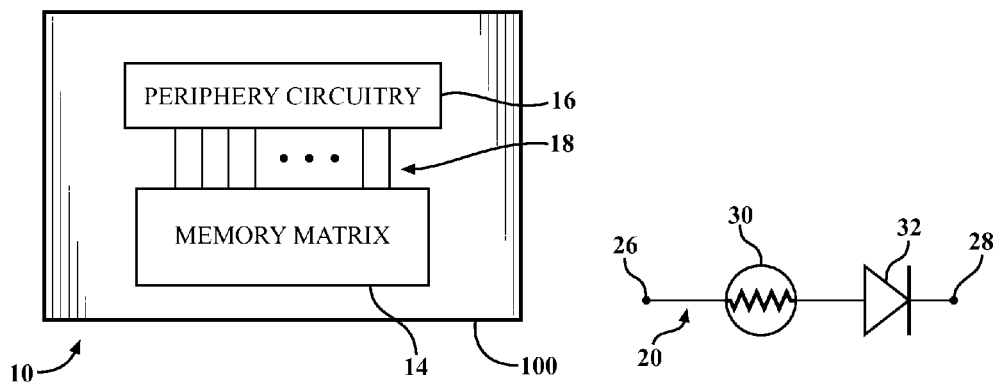
FIG. 1
FIG. 3
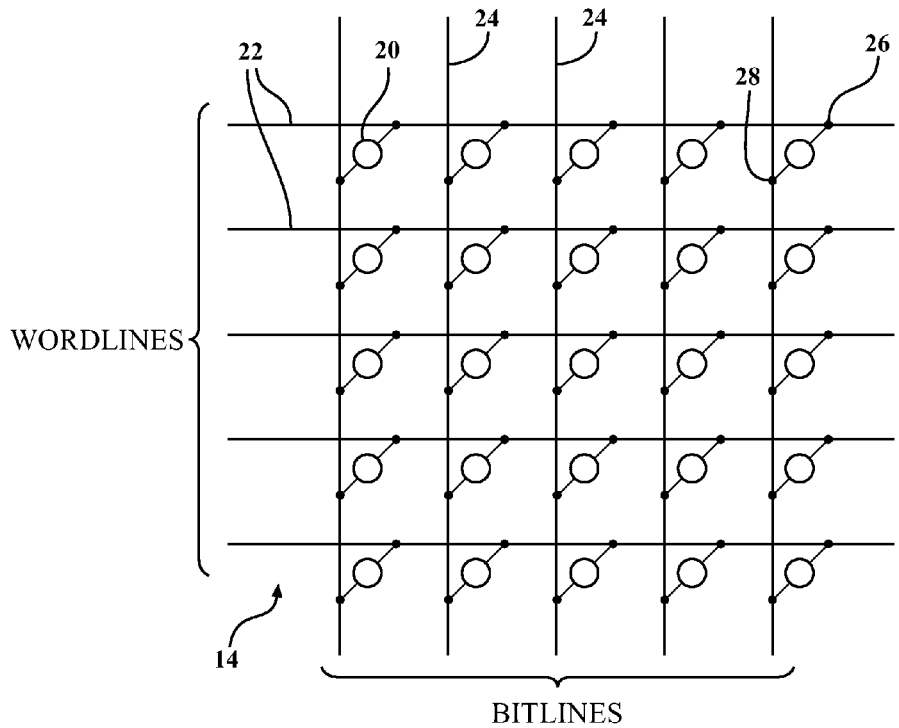
FIG. 2

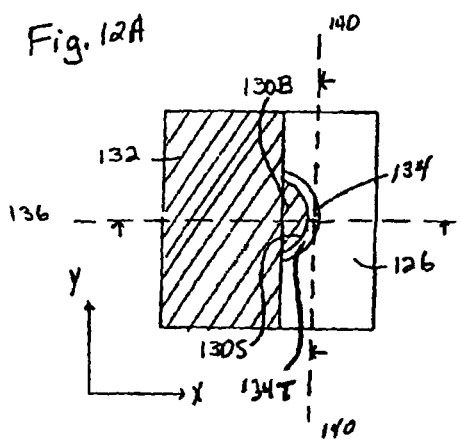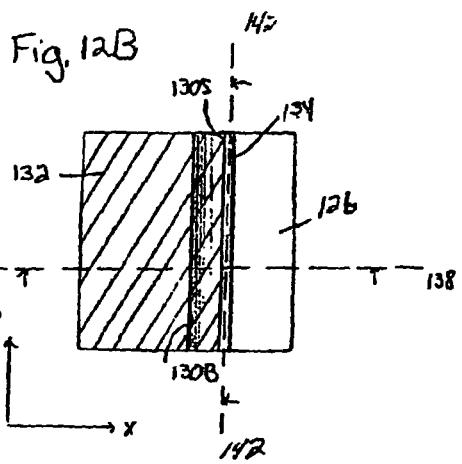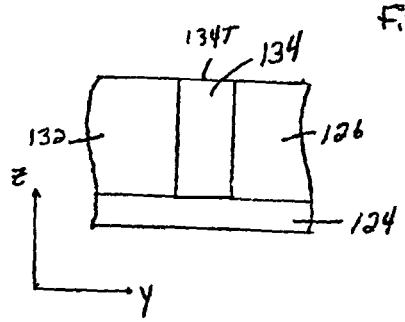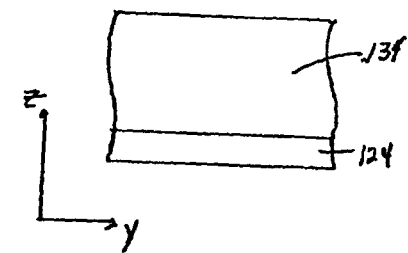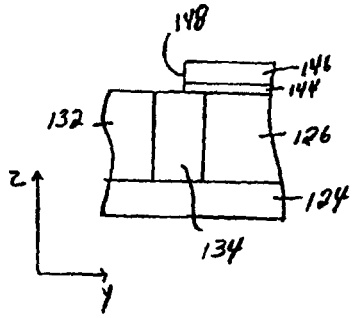

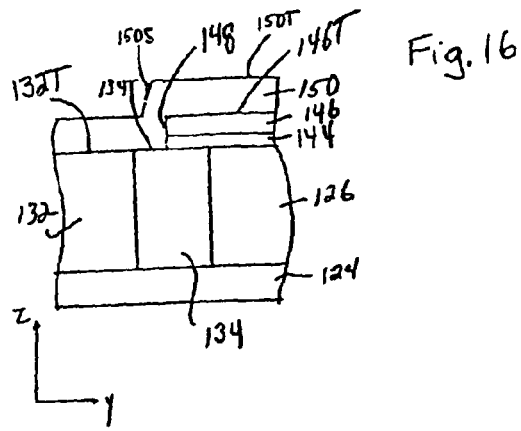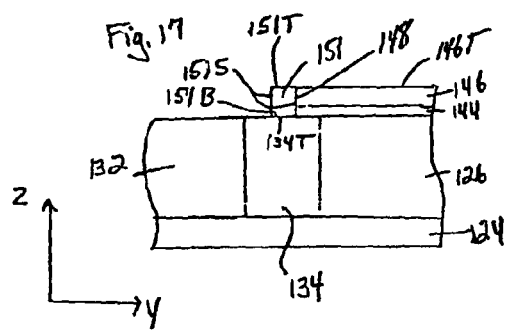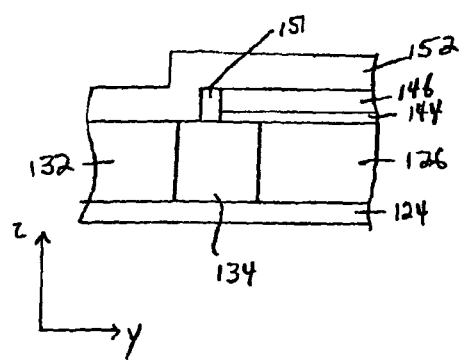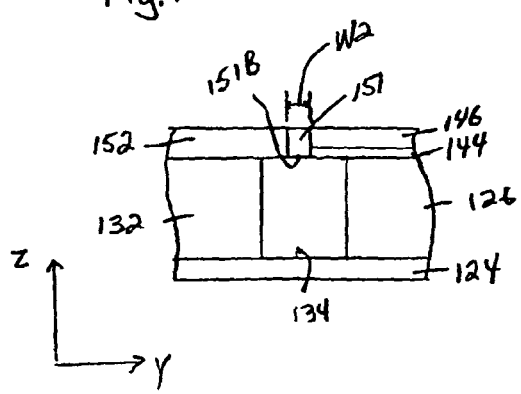

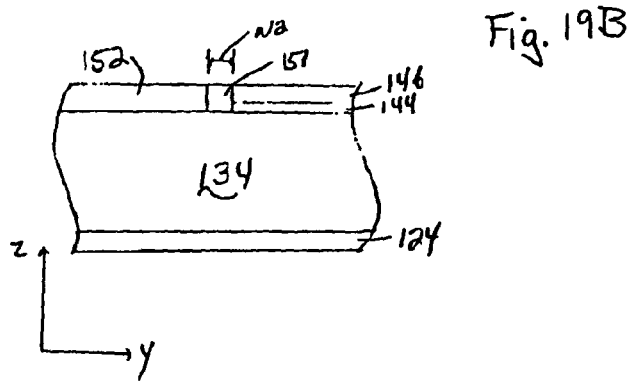
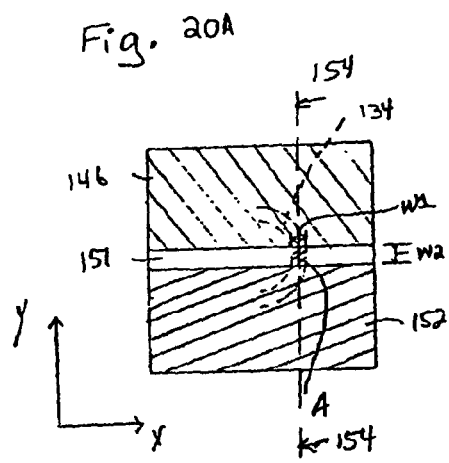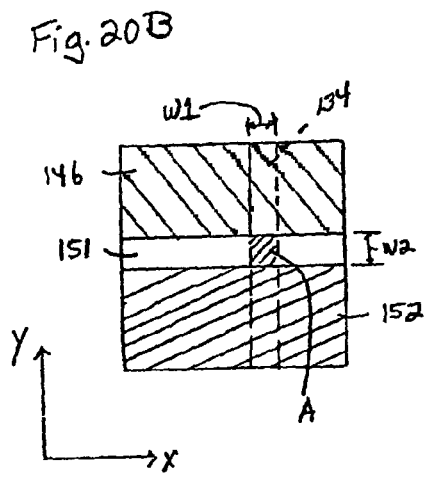
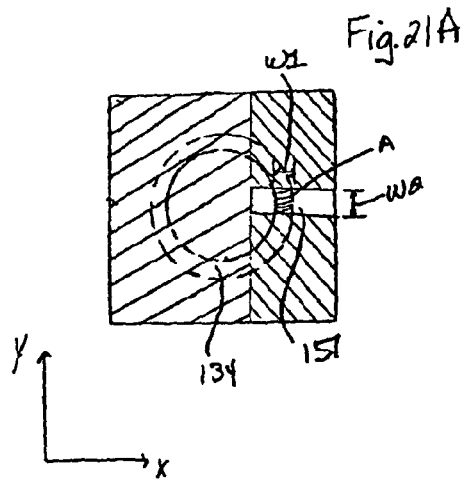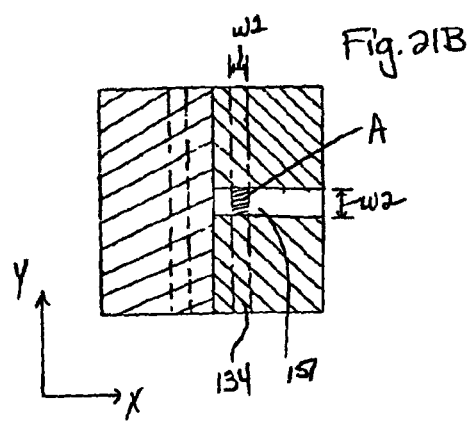

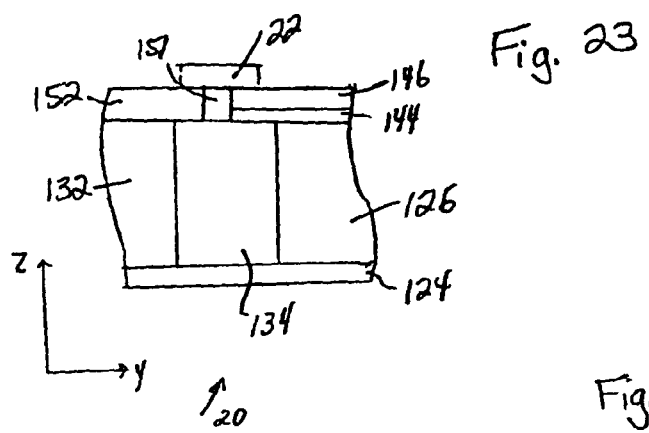
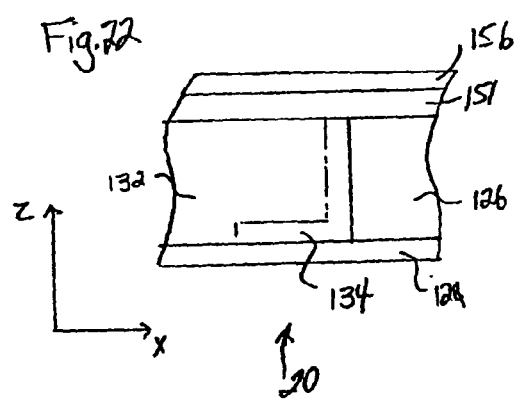

PROGRAMMABLE RESISTANCE MEMORY ELEMENT

RELATED U.S. APPLICATION DATA

This application is a continuation of U.S. patent application Ser. No. 12/069,046, filed on Feb. 7, 2008 now U.S. Pat. No. 7,833,823; which is a division of U.S. patent application Ser. No. 10/269,048, filed Oct. 10, 2002, now abandoned; which is a continuation-in-part of U.S. patent application Ser. No. 09/276,273, filed on Mar. 25, 1999, now U.S. Pat. No. 6,969,866; which is a continuation-in-part of U.S. patent application Ser. No. 08/942,000, filed on Oct. 1, 1997, now abandoned.

FIELD OF INVENTION

The present invention relates to memory elements and, more particularly, to programmable resistance memory elements.

BACKGROUND OF THE INVENTION

Memory elements formed from materials that can be programmed to exhibit at least two detectably distinct electrical resistivities are known in the art. One type of material that can be used as material for these programmable elements is phase-change material. Phase-change materials may be programmed between a first structural phase where the material is generally more amorphous and a second structural phase where the material is generally more crystalline. The term amorphous, as used herein, refers to a condition that is relatively structurally less ordered or more disordered than a single crystal and has a detectable characteristic, such as high electrical resistivity. The term crystalline as used herein, refers to a condition that is relatively structurally more ordered than amorphous and has lower electrical resistivity than the amorphous phase. Since programmable memory elements made with a phase-change material can be programmed to a high resistance state or a low resistance state by changing the phase of the material, one phase can be used to store a logic 0 data bit, for example, while the other is used to store a logic 1 data bit.

The concept of utilizing phase-change materials for electronic memory applications is disclosed, for example, in U.S. Pat. Nos. 3,271,591 and 3,530,441. The early phase-change materials described in the '591 and '441 patents were based on changes in local structural order. The changes in structural order were typically accompanied by atomic migration of certain species within the material. Such atomic migration between the amorphous and crystalline phases made programming energies relatively high; the electrical energy required to produce a detectable change in resistance in these materials was typically in the range of about a microjoule. This amount of energy had to be delivered to each individual memory element in a solid state matrix of rows and columns that made up a memory device. High energy requirements translated into high current carrying requirements for the address lines and for an isolation/address device associated with each discrete memory element in the memory device.

The high energy requirements needed to program the resistance of the memory elements described in the '591 and '441 patents limited their use as a direct and universal replacement for present computer memory applications, such as tape, floppy disks, magnetic or optical hard disk drives, solid state disk flash, dynamic random access memory (DRAM), static random access memory (SRAM) and socket flash memory.

For example, low programming energy is important when using a plurality of programmable memory elements as electrically erasable programmable read-only memory (EEPROM), used for large-scale archival storage. Reducing the power consumption of mechanical hard drives (such as magnetic or optical hard drives) by replacement with EEPROM hard drives is of particular interest in such applications as lap-top computers because the mechanical hard disk drive is one of the largest power consumers therein. However, if the EEPROM replacement for hard drives has high programming current requirements, and consequently high power requirements, the power savings may be inconsequential or, at best, unsubstantial. Thus, programmable memory elements, in order to be used in memory devices capable of replacing a variety of conventional memory, require low programming energy.

The programming energy requirements of individual memory elements may be reduced in different ways. For example, the programming energy may be reduced by appropriate selection of the composition of the memory material. An example of a phase-change material having reduced energy requirements is described in U.S. Pat. No. 5,166,758, the disclosure of which is incorporated herein by reference. Other examples of memory materials are provided in U.S. Pat. Nos. 5,296,716, 5,414,271, 5,359,205, and 5,534,712, the disclosures of which are all incorporated herein by reference.

It has been further found that the performance of devices incorporating these memory elements are closely linked to the active volume of the phase-change material that is being addressed. Thus, the programming energy requirement may also be reduced through appropriate modification of the electrical connection whereby programming energy is delivered to the memory material. For example, a reduction in programming energy may be achieved by modifying the composition or shape of the electrical connection. Examples of such modifications are provided in U.S. Pat. Nos. 5,341,328, 5,406,509, 5,534,711, 5,536,947, 5,933,365 and RE37,259, the disclosures of which are all incorporated herein by reference.

The memory elements are generally formed in integrated circuits using sequential wafer processing. However, optimal performance and minimal programming current, and thus minimal energy, are typically obtained at dimensions for the active volume of phase-change material that fall below the minimum printable lithographic dimension. That is, using standard wafer processing techniques where the area of contact between an electrode and the phase-change material are lithographically-defined, the area of contact, and thus the active volume of phase-change material extending from that area of contact, may be larger than desired. Modification of the electrical connection, which typically involves the addition of processing steps in the formation of the memory element designed to reduce the active volume, can be complicated and add variability in the area of contact from element-to-element in a memory array including many such elements.

SUMMARY OF THE INVENTION

An aspect of the present invention is an improved programmable resistance memory element in which the energy requirements for the programming of the element may be reduced. This may be accomplished by a programmable memory element comprising a region of conductive material embedded in a first region of dielectric material deposited upon a substrate. The conductive material is adapted to receive an electrical input signal from a signal source. The element also includes a sidewall layer of memory material embedded in a second dielectric region deposited upon the first region, a bottom surface of the sidewall layer of memory material is in electrical communication with a top surface of the region of conductive material. The memory material is preferably formed as a sidewall spacer of memory material. The top surface of the conductive material and the bottom surface of the memory material preferably form only one area of contact. The area of contact preferably has dimensions corresponding to a width of the top surface of the conductive material and a width of the bottom surface of the memory material. The width of the top surface of the conductive material and the width of the bottom surface of the memory material may each be non-lithographically defined.

Another aspect of the present invention is a programmable memory element, comprising: an electrode; and a sidewall layer of programmable resistance memory material having a bottom surface in electrical communication with the electrode. The sidewall layer of programmable resistance memory material is preferably a sidewall spacer of programmable resistance material.

Another aspect of the present invention is a method of forming a programmable resistance memory element in such a way that the programming energy requirement for the element may be reduced. The method of forming the programmable memory element comprises the step of embedding a region of conductive material in a first region of dielectric material deposited upon a substrate, the conductive material adapted to receive an electrical input signal from a signal source. The method further includes the step of embedding a sidewall layer of memory material in a second dielectric region deposited upon the first region, a bottom surface of the sidewall layer of memory material in electrical communication with a top surface of the region of conductive material. The memory material is preferably in the form of a sidewall spacer of memory material. The top surface and the bottom surface preferably form only one area of contact between the region of conductive material and the sidewall layer of memory material, the area of contact preferably having dimensions corresponding to a width of the top surface and a width of the bottom surface.

Variations in the inventive memory element and method according to the present invention are contemplated and are described herein.

BRIEF DESCRIPTION OF THE DRAWINGS

The various features, advantages and other uses of the invention will become more apparent by referring to the following detailed description and drawing in which like numbers refer to like elements throughout the several views and in which:

FIG. 1 is a high-level diagram of a memory device including periphery circuitry and a memory array incorporating programmable resistance memory elements according to the present invention;

FIG. 2 is a schematic diagram of a memory array according to FIG. 1;

FIG. 3 is a schematic diagram of a memory cell incorporating a memory element and an isolation device;

FIGS. 6 through 19B are simplified two- and three-dimensional representations of the fabrication layers of memory elements incorporating the isolation device of FIG. 5 and corresponding to steps 50 through 78 of FIG. 4;

FIG. 20A is a plan view of a first embodiment of a memory element showing the contact area of the memory material and a first electrode prior to the placement of a second electrode;

FIG. 20B is a plan view of a second embodiment of a memory element showing the contact area of the memory material and the first electrode prior to the placement of the second electrode;

FIG. 21A is an alternative embodiment of FIG. 20A;

FIG. 21B is an alternative embodiment of FIG. 20B; and

FIGS. 22 through 23 are simplified two-dimensional representations of the fabrication layers of memory elements incorporating the isolation device of FIG. 5 and corresponding to steps 80 through 84 of FIG. 4.

DETAILED DESCRIPTION

Figure 4:
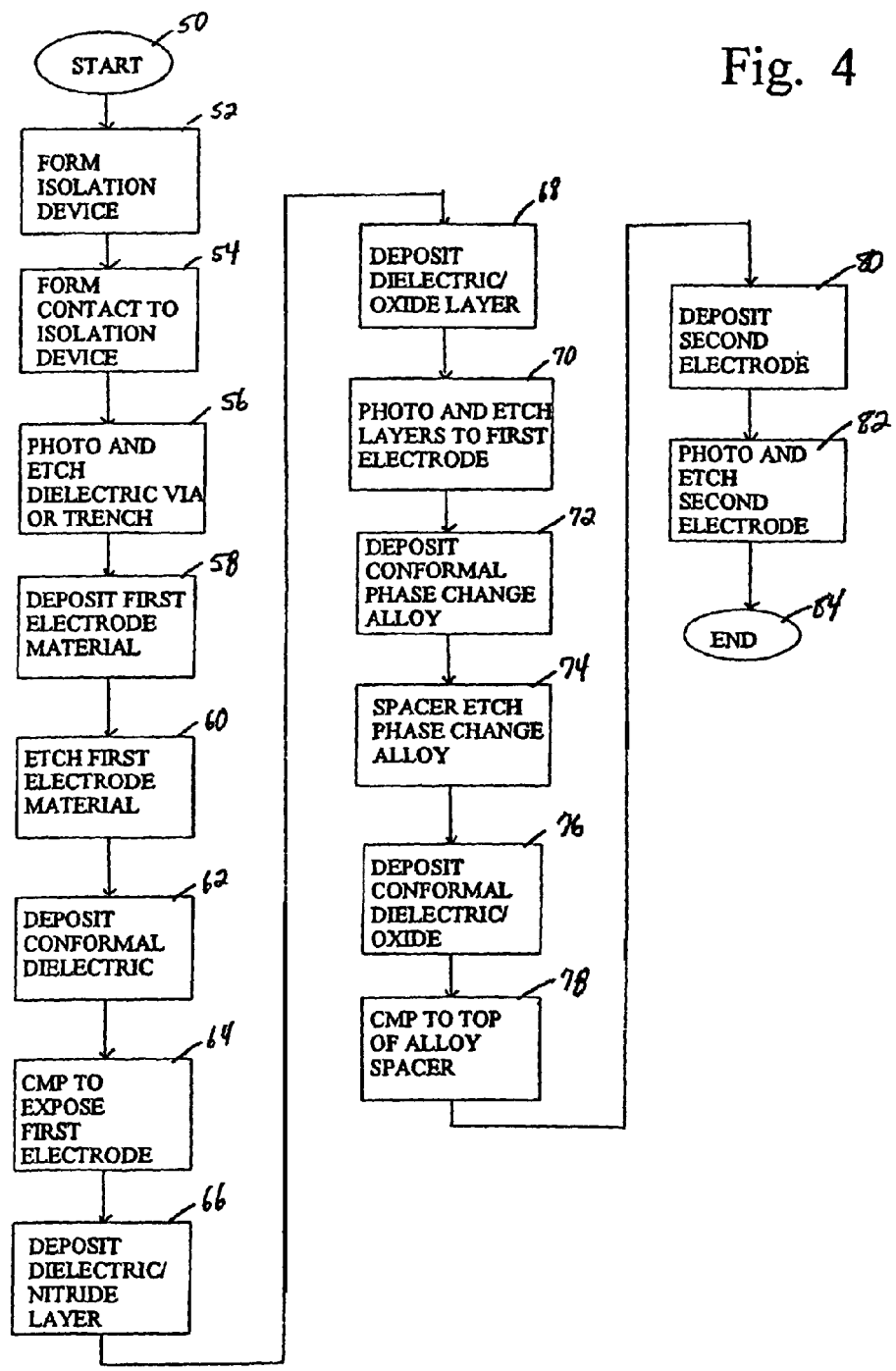
FIG. 4 is a block diagram of a process for making a memory cell incorporating the programmable resistance memory element according to one embodiment of the present invention.

Programmable resistance memory elements comprise a volume of phase-change memory material that is programmable between at least a first resistance state and a second resistance state in response to programming electrical signals, such as currents, of different amplitudes and durations. Memory material programmable to two resistance states means that the associated memory element is capable of storing a single bit of information, either a logic 0 or a logic 1, for example. In another embodiment, the memory material is programmable to at least three resistance states so that each of the memory elements is capable of storing more than one bit of information. For example, memory material programmable to at least four resistance states makes a memory element capable of storing at least two bits of information. Each of the resistance states resulting from a programming electrical signal is assigned a value, such as logic 0 or logic 1 where two resistive states exist. Another electrical signal, a read electrical signal, applied to the memory element may be used to read the resistance of the memory material, thus indicating the value stored by the memory element.

The memory element also includes means for delivering these electrical signals from a signal source to the volume of memory material. As described herein, the electrical signals for each memory element are supplied by one or more electrical connections, referred to as electrodes herein. Although it is preferred, the electrodes do not have to be in physical contact with the memory material as discussed in more detail herein; they merely need to be in electrical communication with the memory material. Additional details regarding the programming and reading of the memory elements are included in, for example, U.S. Pat. Nos. 5,912,839 and 6,075,719, each of which is incorporated herein by reference.

Turning now to the drawings, and referring initially to FIG. 1, individual programmable resistance memory elements (shown in FIG. 2) can be combined into a memory array, or matrix, 14 in a memory device 10. The memory device 10 includes a plurality of memory cells 20 for storing data. The memory matrix 14 is an integrated circuit memory array 14 and is coupled to periphery circuitry 16 by a plurality of control lines 18. The periphery circuitry 16 includes circuitry for addressing the memory cells 20 contained within the memory and may include circuitry for storing data in and retrieving data from the memory cells 20. The periphery circuitry 16 may also include other circuitry used for controlling or otherwise ensuring the proper functioning of the memory device 10. The memory matrix 14 and the periphery circuitry 16 of the memory device 10 are shown on a common semiconductor substrate 100, but this is not necessary. The matrix 14 and circuitry 16 could each be one or more separate integrated circuits coupled on one or more circuit boards with appropriate interconnections.

A schematic diagram of the memory array 14 is shown in FIG. 2. As can be seen, the memory array 14 includes a plurality of memory cells 20 arranged in generally perpendicular rows and columns. The memory cells 20 in each row are coupled together by a respective wordline 22, and the memory cells 20 in each column are coupled together by a respective bitline 24. More specifically, each memory cell 20 includes a wordline node 26 that is coupled to a respective wordline 22, and each memory cell 20 includes a bitline node 28 that is coupled to a respective bitline 24. The conductive wordlines 22 and bitlines 24 are electrically coupled to the periphery circuitry 16 (shown in FIG. 1) through the control lines 18 so that each of the memory cells 20 can be accessed for the storage and retrieval of information.

FIG. 3 illustrates an exemplary memory cell 20 that may be used in the memory array 14. The memory cell 20 includes a memory element 30 coupled to an address device 32 that electrically isolates each memory element 30 from all other memory elements 30 in the array 14. The address devices 32 thus permit each discrete memory cell 20 to be read and written to without interfering with information stored in adjacent or remote memory cells 20 of the array 14. While the address device 32 is shown as a diode 32 in FIG. 3, the memory cells 20 may incorporate any type of isolation/addressing device. For example, a transistor, such as a bipolar junction transistor and any type of field-effect transistor (FET) including a junction FET (JFET) and a metal oxide semiconductor FET (MOSFET), can be used in place of the diode 32. The memory element 30 is a programmable resistive element that can be made of a chalcogen and other materials, as will be more fully explained below. As illustrated in FIG. 3, the memory element 30 is coupled to a wordline 22 at a wordline node 26, and the diode 32 is coupled to a bitline 24 at a bitline node 28. However, it should be understood that these connections of the memory cell 20 may be reversed without adversely affecting its operation or the operation of the memory array 14.

The process steps associated with making a memory cell 20 according to FIG. 3 are shown in FIG. 4 starting at step 50, with steps illustrated with reference to FIGS. 5-23, which are not drawn to scale. The memory cell 20 is preferably formed upon a single crystal silicon semiconductor wafer, or substrate, 100 incorporating the address devices 32, the conductive wordlines 22 and bitlines 24 and the memory elements 30. It is efficient to fabricate the address devices 32 and the memory elements 30 on the same substrate 100 in the manner described. One of skill in the art will recognize from the description herein, however, that other arrangements of the address devices 32 and the memory elements 30 are possible. For example, the address devices 32 may be fabricated on a separate section of the substrate 100 from the memory elements 30 with electrical communications provided between the sections. This description also, as mentioned, assumes that the address device is a diode 32. Use of another address device 32 requires changes in the fabrication layers herein described, which changes are within the level of skill of one in the art.

Figure 5:
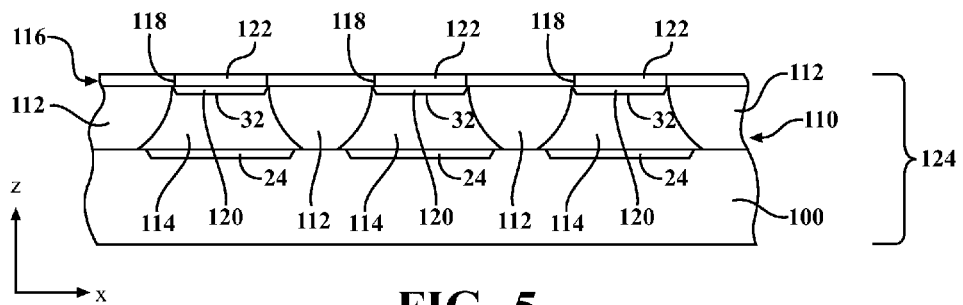
FIG. 5 is a simplified two-dimensional representation of the fabrication of an isolation device of the memory cell of FIG. 3.

In step 50, the isolation/address device, the diode 32, is formed in a multi-step process. The cross-sectional view of a partial result of the process is shown in FIG. 5. The wafer substrate is first p-doped to form a p-substrate 100. Formed in the p-substrate 100 by diffusion in a manner well known in the art are n+ channels forming the conductive bitlines 24 extending across the chip in a direction perpendicular to the plane of the illustration, i.e., in the y direction. On top of this n+ grid is formed an n-doped crystalline epitaxial layer 110, which may be about 5,000 Angstroms thick, by example. Using known masking and doping techniques, p-doped isolation channels 112 are formed in the n-epitaxial layer 110. These p-doped isolation channels 112 extend all the way down into the p-substrate 100 and extend completely around and isolate and define islands 114 of the n-epitaxial layer 110. Instead of p-doped isolation channels, silicon dioxide ($SiO_2$) isolation trenches can be used for isolation of the islands 114 according to known techniques.

A layer 116 of thermally grown $SiO_2$ is then deposited over this structure. Etching, again according to known techniques, forms apertures 118 in the layer 116 over the islands 114. Diffusion regions 120 of p+ material are formed within the areas defined by the apertures 118. The semiconductor junctions of the p+ regions 120 and the n-epitaxial layer 110 form p-n junction diodes 32 in series with each of the regions of the n-epitaxial layer exposed through the apertures 118 of the $SiO_2$ layer 116.

A contact 122 to each diode 32 is next formed in the aperture 118 in step 54, again according to known techniques. Alternatively, as one of skill in the art will realize from the description herein, the contacts 122 can be self-aligned after step 56. It should be noted that although a plurality of contacts 122 are shown formed in the apertures 118 used to form the diffused p+ regions 120, this is not necessary. First, in certain embodiments, the contact 122 may be omitted as the first electrode 134, described herein, can perform the series contact with the p+ region 120. Alternatively, each contact 122 is in a conductive path with the p+ region 120, but extends laterally, i.e., in the x direction, from a region adjacent the p+ region 120 to a region corresponding to at least a portion of an adjoining isolation channel 112. The contact 122 can also be one continuous contact 122 coupled to an insulation layer (not shown). The contact(s) 122 can be a silicide such as titanium silicide, cobalt silicide or tungsten silicide, but can comprise other materials according to desired barrier and conductive properties. Suitable materials for the contact(s) 122 any insulation layer(s), are discussed in detail in U.S. Pat. Nos. 5,933,364 and RE37,259.

Starting at step 56, the memory elements 30 are deposited over respective contacts 122, if included, or otherwise in individual ohmic electrical series contact with the p+ regions 120 the diodes 32 to create memory cells 20. To simplify the drawing figures, the remainder of the steps will show the configuration of FIG. 5 upon which one exemplary memory element 30 is deposited as reference number 124. It should be understood that while the fabrication of only a single memory cell 20 is discussed, a plurality of similar memory cells 20 are typically fabricated simultaneously. Although not illustrated in this one element 30 example, each memory element 30 is electrically isolated from other memory elements 30 in any suitable manner, such as by the addition of embedded field oxide regions, so that each memory cell 20 of the array 14 is electrically isolated.

In step 56, a photo and etch process is performed to create a via or trench 128 in a dielectric layer, preferably an oxide layer. First, and as shown with reference to FIG. 6, a layer of dielectric material 126 is formed on top of the substrate base 124. The dielectric layer 126 is any suitable dielectric material and is preferably a first oxide layer, i.e., $SiO_2$, deposited by a known technique, such as by chemical vapor deposition (CVD). In a top surface 126T of the first oxide layer 126, an opening 128 is formed by a suitable method to the contact 122, or to the underlying p+ region 120 where the contact 122 is not used. The photo and etch process is a standard photolithographic technique whereby a photoresist is first spun onto the top of a surface, here the layers of the substrate 100, at high speed to form a thin uniform layer. A positive photoresist, or resist, is a photo-sensitive chemical that, when exposed to light, can be dissolved and removed by resist developer. A mask, which contains a pattern of transparent and opaque areas, is laid over the chip, and the mask is exposed to light. The resist not exposed to light hardens and provides protection for the portions of the layers under that resist. The exposed resist is removed and an etch according to any number of known methods can occur on the underlying layers. Then, the remaining resist is removed in preparation for the next step. Although all of these steps are not discussed explicitly herein with respect to the steps of the present invention, it is recognized by one of skill in the art that photolithography is generally a part of the fabrication of each layer of a chip.

Figure 6:
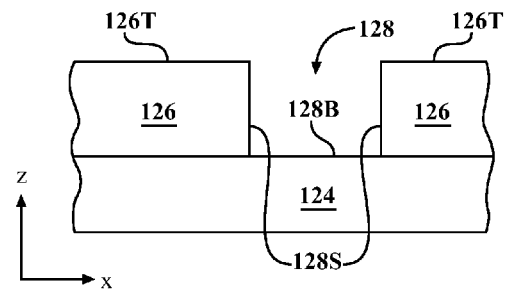
Figure 7A:
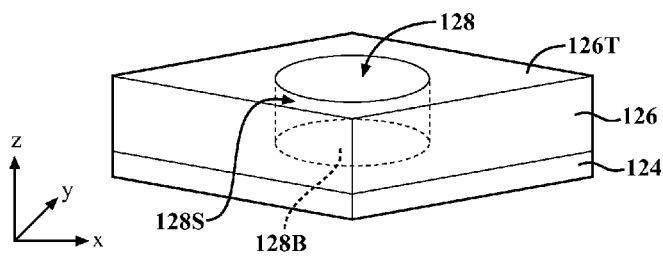
Figure 7B:
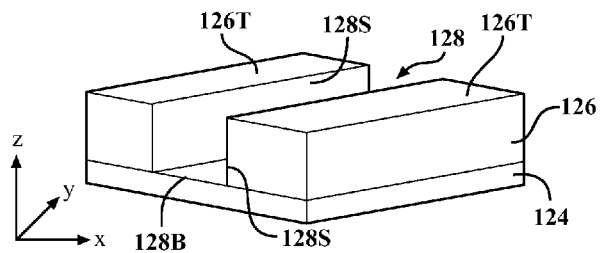

Here, using standard photolithographic techniques, a mask (not shown) may be deposited on top of the first oxide layer 126 with the appropriate pattern. The opening 128 may thus be sized at the photolithographic limit, which is currently greater than 0.1 .mu.m (1000 Angstroms). The opening 128 may be any shape. In FIG. 6, the opening 128 is shown as a via, i.e., a hole, in the insulating first oxide layer 126. The via 128 is substantially circular, but may be rectangular, for example. FIG. 7A is a simplified three-dimensional representation of FIG. 6 where the opening is a via 128. Alternately, the opening may be formed as a shallow trench 128 as shown in FIG. 7B. The opening 128, in any case, includes a bottom surface 128B and at least one sidewall surface 128S adjacent the periphery of the opening 128. The sidewall surface 128S of the opening corresponds to the sidewall surface or sidewall surfaces of the oxide 126. Although the bottom surface 128B is more clearly seen where the opening is a via 128, the bottom surface 128B of a trench 128 is between two roughly parallel sidewall surfaces 128S and adjacent the contact 122. As shown in the embodiments of the openings of FIGS. 7A and 7B, the sidewall surface(s) 128S are preferably substantially vertically disposed (that is, they are preferably perpendicular to the substrate).

Figure 8:
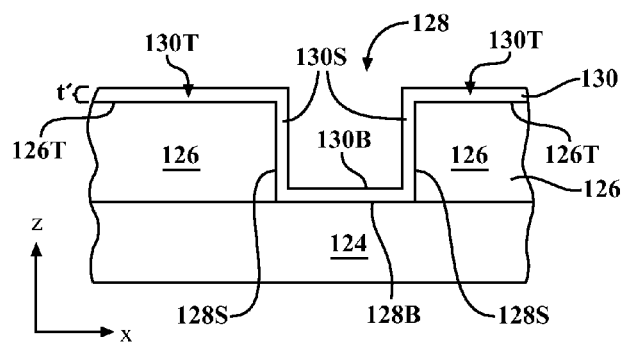

The process next proceeds to step 58, where the first electrode material is deposited. Specifically, a conductive layer 130 is deposited onto the structure shown in either FIG. 7A or 7B. As illustrated in FIG. 8, the conductive layer 130 is deposited on the top surface 126T of the first oxide layer 126, as well as on the sidewall surface 128S and on the bottom surface 128B of the via 128. Hence, the layer 130 has a top portion 130T that is formed on the top surface 126T, a sidewall portion 130S that is formed on the sidewall surface 128S and a bottom portion 130B that is formed on the bottom surface 128B. Whatever form the opening 128 takes, the deposition of the layer 130 is preferably a substantially conformal deposition. Hence, the top portion 130T of layer 130 preferably conforms to the top surface 126T, the sidewall portion 130S of layer 130 preferably conforms to the sidewall surface 128S, and the bottom portion 130B preferably conform to the bottom surface 128B of the via 128. The thickness "t" of the conductive layer 130 is shown.

The conductive material used for the conductive layer 130 may be any conductive material and may include, but is not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum and titanium nitride. Other examples include titanium carbon-nitride, titanium aluminum-nitride, titanium silicon-nitride and carbon.

Figure 9A:
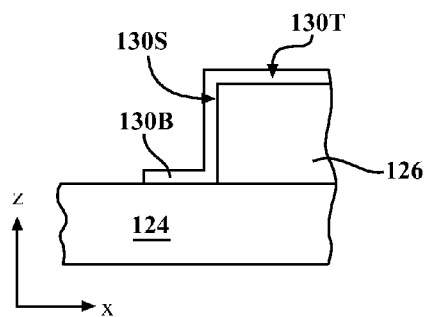
Figure 9B:
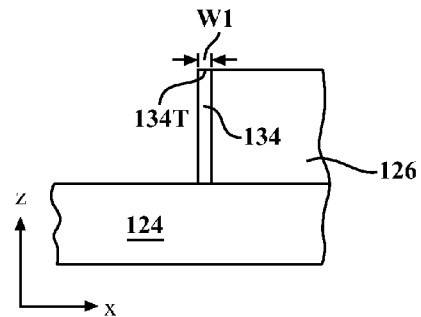

A portion of the conductive layer 130 forms the first, or bottom electrode in contact with the memory material 150 (not shown in FIG. 8) of the memory element 30. Forming a suitable contact region for the first electrode starts when the conductive layer 130 is etched in the process at step 60. If the opening is a trench 128, a directional spacer etch is preferably performed, which etch is preferably selective to the first oxide layer 126 and the contact 122. This anisotropic etch is preferably a dry etch, i.e., it is carried out by a reactive gas. The dry etch can be a plasma etch, a reactive ion etch or a magnetically enhanced reactive ion etch, for example. A plasma etch uses a gas such as hydrogen bromide or chlorine. The result of this step is to remove substantially all portions of the conductive layer 130 that are parallel to the substrate (that is, that are horizontal) and leave substantially all portions which are perpendicular to substrate (that is, that are vertical). Hence, the anisotropic etch removes substantially all of the horizontally disposed top layer portion 130T and substantially all of the horizontally disposed bottom layer portion 130B. The etch leaves substantially all of the sidewall layer portion 130S that was formed on the sidewall surface 128S. Referring to FIG. 9B, the result of the anisotropic etch is to leave a sidewall layer 134 of conductive material. In the embodiment shown, the sidewall layer 134 of conductive material is a sidewall spacer of conductive material.

If the opening is a via 128, an angular etch of a select portion of the conductive layer 130 is also possible. Of course, such an etch may also remove a portion of the first oxide layer 126. The angular etch can be performed by, for example, ion milling directed at a 45 or 60 degree angle to the plane of the substrate 100. The appearance of the conductive layer 130 after this step is shown in FIG. 9A. Alternatively, and although not shown in the process steps, a conventional photo and etch step can be performed after step 64 but prior to step 66, as discussed herein.

Figure 10:
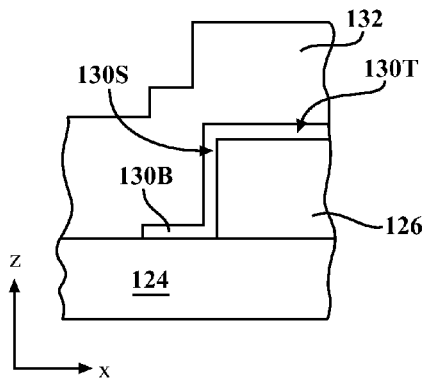

In step 62, a conformal dielectric layer 132 is again deposited by a known technique, such as by CVD. This dielectric layer 132, like the first oxide layer 126, can be any suitable dielectric material, but is preferably $SiO_2$ and is thus referred to herein as the second oxide layer 132. This conformal second oxide layer 132 is shown in FIG. 10 for the embodiment where the opening is a via 128. In step 64, dry etching or chemical mechanical planarization (CMP) is used to planarize the top surface of the structure of FIG. 10, or a corresponding structure where the opening is a trench 128, to expose an embedded conductive layer 134. Of course, when using CMP an etch stop is sometimes useful. An etch stop is a layer of material of a character that slows the etch process, but does not necessarily stop the etch. It provides a means for indicating when the etch is nearing completion. Here, such a stop can be optionally deposited on the top surface 126T of the oxide layer 126 during step 56. During the planarization in step 64, the stop, when detected, can be removed by known means, such as dry etching, and a minimal re-polish can occur after the removal. In either case, the structure of FIG. 10 after this planarization step is shown in FIG. 11.

Figure 11:
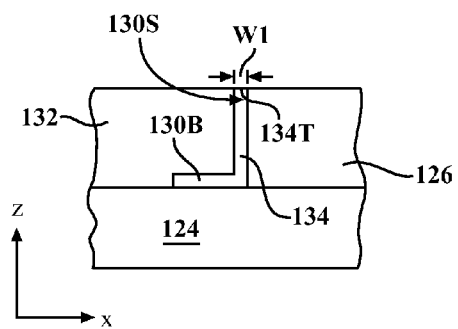

In the embodiment shown in FIG. 11, the resulting embedded conductive layer 134 (which is the bottom electrode of the memory element) includes a portion which is a sidewall layer 130S formed on the sidewall surface of the oxide 126. The conductive layer 134 also includes an additional component. In the embodiment shown in FIG. 11, the additional component is a substantially horizontally disposed bottom layer 130B. (It is noted that the conductive layer 134 may be formed on a bottom surface and a sidewall surface of an opening, such as a hole or trench, so as to form a conductive liner).

Hence, in the embodiments shown FIGS. 9B and 11, the bottom electrode of the memory element (which is the conductive layer 134 shown in FIGS. 9B and 11) includes a sidewall layer of conductive material formed on a sidewall surface. The bottom electrode may also include an additional component, such as the horizontally disposed bottom layer of conductive material 130B.

As noted, the conductive layer 134 forms a bottom electrode for the memory element. Also, as noted above, in the embodiments of invention shown in FIGS. 9B and 11, the conductive layer 134 includes a sidewall layer of conductive material. More generally, the bottom electrode may take any form and have any structure. The conductive layer 134 is more generically referred to as a conductive region 134 herein. This is to clarify that the conductive region 134, may have any shape and is not limited to the shapes shown in the embodiments of FIGS. 9B and 11. Hence, it is possible, that the bottom electrode may take any form or shape (and it does not have to include a conductive sidewall layer).

Preferably, the portion of the top surface 134T of the conductive region 134 exposed to the memory material layer 150, described herein, has a dimension less than the photolithographic limit. Using the example of the embodiments shown in FIGS. 9B and 11, this dimension is a width W1. The width W1 is preferably less than about 1000 Angstroms, more preferably less than about 500 Angstroms, and most preferably less than about 300 Angstroms.

In the embodiments shown in FIGS. 9B and 11, the width W1 of the top surface 134T of the sidewall layer 134 is defined by the thickness of the conformal deposition of the conductive layer 130 shown in FIG. 8. This width W1 is preferably smaller than that achievable by standard photolithography. More specifically, the width W1 is preferably less than the photolithographic limit. As discussed, the photolithographic limit is currently greater than approximately 0.1 .mu.m (1000-Angstroms). In other embodiments, one where the top surface 134T is shaped as an annulus (or a portion of an annulus), for example, the width W1 could be the difference between the inner and outer diameters of the annulus. Possible values for the width W1 will be discussed in more detail herein.

FIG. 12A is a top view of the structure of FIG. 10 showing the exposed top surface 134T of the conductive region 134 and the first and second oxide layers 126 and 132. Similarly, a top view of the structure of FIG. 9B after performing steps 62 and 64 is shown in FIG. 12B. Although a bottom portion 130B of the conductive layer 130 in is shown in FIGS. 12A and 12B for clarity, the figures make it clear that the second oxide layer 132 covers whatever remains of the bottom portion 130B, since most of the bottom portion 130B can be removed. It is also clear in FIG. 12B that the section of the sidewall portion 130S not perpendicular to the plane of the figure is also covered by the second oxide layer 132 in this view. Thus, in FIG. 12A the only portion of the conductive region 134 exposed through the dielectric region formed by the remaining portions of the first and second oxide layers 126 and 132 is a semicircular top surface 134T of a sidewall layer of width W1. Similarly, in FIG. 12B, the only portion of the conductive region 134 exposed through the dielectric region formed by the remaining portions of the first and second oxide layers 126 and 132 is a straight top surface of a sidewall layer having a width W1.

The cross-sectional views of FIGS. 5, 6, 8, 9A, 10 and 11 are shown in the direction indicated along line 136-136 in FIG. 12A, while the cross-sectional view of FIG. 9B is shown in the direction indicated along line 138-138 in FIG. 12B. For the discussion of the next steps of FIG. 4, the cross-sectional views in the directions indicated by line 140-140 of FIG. 12A and line 142-142 of FIG. 12B are used. These views are shown in FIGS. 13A and 13B, respectively.

In step 66 of FIG. 4, a thin, conformal dielectric layer 144 is deposited by known techniques, such and physical or chemical vapor deposition. Although a nitride, i.e., silicon nitride $Si_3N_4$, is preferred, an insulator with a similar dielectric constant and good barrier properties can also be used. To distinguish this dielectric layer 144 from the other layers, it is referred to herein as the nitride layer 144. In step 68, another dielectric layer 146 is conformally deposited, again according to known methods. Although like the first and second oxide layers 126, 132, layer 146 typically comprises $SiO_2$, another excellent insulator material can be used. If $SiO_2$ is used in any or all of the layers 126, 132, 146, its source is preferably tetraethyl orthosilicate (TEOS). The structure of FIG. 13A including these layers is shown in FIG. 14. The dielectric layer 146 is referred to as the third oxide layer 146 herein to distinguish it from the remainder of the layers.

A photo and etch step is performed in step 70, which preferably results in a sidewall surface 148 shown in FIG. 15. The sidewall surface 148 extends through the nitride layer 144 and the third oxide layer 146 to contact the top surface 134T of the conductive region 134. It is possible that the sidewall surface 148 may be formed as the sidewall surface of an opening such as a trench or a hole (the hole may have a circular cross-section). In step 72, a layer 150 of memory material is deposited over the top of the structure of FIG. 15. The memory material comprising the layer 150 may be any programmable resistance material known in the art. Preferably, the programmable resistance material is a phase-change material. Preferably, the phase-change material is capable of exhibiting a first order phase transition. For example, U.S. Pat. No. 5,166,758 and other prior art patents describe a phase-change memory material incorporating at least one chalcogen element. The chalcogen element may be chosen from the group consisting of Te, Se and mixtures or alloys thereof. The memory material may further include at least one element selected from the group consisting of Ge, Sb, Bi, Pb, Sn, As, S, Si, P, O and mixtures or alloys thereof. In one embodiment, the memory material comprises the elements Te, Ge and Sb. In another embodiment, the memory material consists essentially of Te, Ge and Sb. An example of a memory material that may be used is $Ge_2Sb_2Te_5$.

The phase-change memory material of the layer 150 may also include at least one transition metal element. The term transition metal as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials that include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material including Te, Ge, Sb and a transition metal in the ratio: $(Te_aGe_bSb_{100-(a+b)})_cTM_{100-c}$; wherein the subscripts a, b and c are in atomic percentages totaling 100% of the constituent elements; TM is one or more transition metals, preferably including Cr, Fe, Ni, Nb, Pd, Pt and mixtures or alloys thereof; a and b are as set forth for the basic Te—Ge—Sb ternary system; and c is between about 90% and about 99.99%.

A second example of an elementally modified memory material is a phase-change memory material including Te, Ge, Sb, Se and a transition metal in the ratio: $(Te_aGe_bSb_{100-(a+b)})_cTM_dSe_{100-(c+d)}$; wherein the subscripts a, b, c and d are in atomic percentages totaling 100% of the constituent elements; TM is one or more transition metals, preferably including Cr, Fe, Ni, Nb, Pd, Pt and mixtures or alloys thereof; a and b are as set forth for the basic Te—Ge—Sb ternary system; c is between about 90% and 99.5%; and d is between about 0.01% and 10%. Other details of suitable memory materials are described in U.S. Pat. No. 5,933,365.

As mentioned, the memory material layer 150 is deposited in step 72 over the top of the structure shown in FIG. 15. It is preferable that the deposition of the memory material layer 150 be a substantially conformal deposition in step 72. The phase-change memory material discussed herein can be sputter deposited while in the substantially amorphous state, but the ability to deposit a conformal layer may be limited by the aspect ratio, i.e., the height of the sidewall surface 148 compared to the width of the top surface 132T of the second oxide layer 132 and the portion of the top surface 134T of the conductive region 134 to be covered. If necessary, the substrate 100 and its layers can be tilted during the deposition in step 72 to improve the profile of the conformal memory material layer 150. Other known techniques typically used for deposition would not generally result in a conforming layer 150. Adjusting the shape of the memory material layer 150 after deposit may be possible by such techniques as reflow and extrusion.

A conformal memory material layer 150 is shown in FIG. 16. As it is substantially conforming, the layer 150 has a top surface 150T roughly conforming to the top of the second oxide layer 132, the portion of the top surface 134T of the conductive region 134 that is not covered by the nitride layer 144, and the third oxide layer 146 and the top surface 146T of the third oxide layer 146. Thus, the memory material layer 150 has a sidewall surface 150S roughly conforming to the sidewall surface 148.

In step 74, a directional anisotropic spacer etch of the memory material layer 150 is performed. Based upon the properties of the phase-change material and the shape of the memory material layer 150, ion milling may be the preferred technique of performing the spacer etch. The structure shown in FIG. 17 is the structure of FIG. 16 after the anisotropic spacer etch of step 74. The anisotropic etch removes substantially all of the horizontally disposed components of the memory material 150. The etch leaves a sidewall layer 151 of memory material on the sidewall surface 148. The sidewall layer of memory material 151 has top surface 151T coincident with the top surface 146T of the third oxide layer 146, a bottom surface 151B adjacent to a portion of the top surface 134T of the conductive region 134, and two sidewall surfaces 150S, one adjacent the sidewall surface 148 and the other opposed. In the embodiment shown the memory material sidewall layer 151 is a sidewall spacer of memory material. It is possible that a memory material sidewall spacer be formed on a sidewall surface of an opening such as a trench or a hole. If the sidewall spacer is formed on a sidewall surface of a trench, then the bottom surface of the sidewall spacer would be a linear strip. If the sidewall spacer is formed on the sidewall surface of a hole with a substantially round cross-section, then the bottom surface of the sidewall spacer would be in the shape of an annulus.

In step 76, a conformal dielectric layer 152, preferably an oxide such as $SiO_2$, is deposited over the structure of FIG. 17. The dielectric layer 152, as with the other conformal layers dielectric layers, can be deposited using any known technique, such as CVD. To distinguish it from the other layers, the dielectric layer 152 is referred to herein as the fourth oxide layer 152. The resulting structure is shown in FIG. 18.

The structure of FIG. 18 is planarized, preferably by CMP, to expose the memory material sidewall layer 151 in step 78. The memory material sidewall layer 151 is embedded in a dielectric region formed of the remaining portions of the nitride layer 144, the third oxide layer 146 and the fourth oxide layer 152. The resulting structure is shown in FIG. 19A for the embodiment of FIGS. 13A and 14-18 wherein the opening is a via 128. Where the opening is a trench 128, steps 66-78 performed on the structure of FIG. 13B results in the structure shown in FIG. 19B. As shown in FIGS. 19A and 19B, the memory material sidewall layer 151 has a width W2, which is defined by the thickness of the conformal deposition of the memory material layer 150 shown in FIG. 16. In particular, the bottom surface 151B of the memory material sidewall layer 151 has a width W2 which is defined by the thickness of the conformal deposition of the memory material layer 150 shown in FIG. 16. Like the width W1 of the exposed top surface 134T of the conductive region 134, the width W2 of the bottom surface 151B of the memory material sidewall layer 151 is preferably smaller than that achievable by standard photolithography. More specifically, the width W2 is preferably less than the photolithographic limit, which is currently greater than approximately 0.1 .mu.m (1000 Angstroms), as previously mentioned. The width W2, like the width W1, will be discussed in more detail herein.

FIG. 20A shows a top view of the structure of FIG. 19A, and FIG. 20B shows a top view of the structure of FIG. 19B. In each of FIGS. 20A and 20B, the top surface 134T of the conductive region 134 is shown with hidden lines so that both the conductive region 134 and the memory material sidewall layer 151 are shown. The top surface 134T of the conductive region 134 and the bottom surface 151B of the memory material sidewall layer 151 are formed so that they essentially lie in planes that overlap in an area of contact A. Substantially all electrical communication between the conductive region 134 and the memory material sidewall layer 151 occurs through this area of contact A. The area of contact A has dimensions that correspond to the widths W1 and W2. That is, the area A is roughly four-sided with a dimension in the x-direction of about width W1 and with a dimension in the y-direction of about width W2.

It is noted that in the embodiment shown in FIGS. 20A and 20B, the width W1 is shown to extend in the x-direction while the width W2 extends in the y-direction. In other embodiments, the width W1 and the width W2 may each extend in directions which are simply non-parallel (i.e. traverse) to each other. Preferably, the width W1 and the width W2 extend in directions which are substantially perpendicular to each other.

It is worth noting that width W1 and width W2 are typically not uniform over the entire area of contact A, and that when it is said that the area of contact A has dimensions that correspond to the widths W1 and W2, it means that the area of contact A is roughly equal to W1 times W2. Variations in surfaces created in the fabrication process, such as variations in the sidewall surface 128S upon which the conductive material 130 is layered or variations in the sidewall surface 148 upon which the memory material 150 is layered, can affect the widths W1 and W2, respectively, over the area A. Indeed, these variations can effect the widths W1 and W2 along the entire length of the top surface 134T and the bottom surface 151B. Surface variations can result from uneven etching, for example. Similarly, variations in the conformal layer of conductive material 130 or memory material 150 formed on the respective sidewall surfaces 128S and 148 can also result in non-uniformity of the widths W1 and W2. The variations that result in the non-uniformity in the widths W1 and W2 can result in an area of contact A that does not have four sides, but instead is only substantially four-sided with, for example, rounded edges.

Further, even if the widths W1 and W2 were uniform along the entire length of the top surface 134T of conductive region 134 and the bottom surface 151B of the memory material sidewall layer 151, respectively, the widths W1 and W2 may not be uniform over the area A. This occurs when either of the surfaces 134T, 151B are not straight sidewall layers created by a trench or sidewall etch as previously described. Directing attention to FIG. 11, for example, when the opening is a via 128, the portion of the top surface 134T contacting the memory material sidewall layer 151 is in the shape of a semicircular wedge. While the width W1 is the width of the wedge between its inner and outer diameters, i.e., the width between the sidewall surface 128S and the sidewall surface 130S, it is clear that the width W1 is not uniform over the entire area A. However, the area of contact A shown in FIGS. 20A-21B can be said to have dimensions corresponding to W1 and W2 and can be approximated by W1 multiplied by W2. Here, the width W1 is preferably less than about 1000 Angstroms, is more preferably less than about 500 Angstroms and is, most preferably, less than about 300 Angstroms. Also, the width W2 is preferably less than about 1000 Angstroms, is more preferably less than about 500 Angstroms and is, most preferably, less than about 300 Angstroms. The area of contact A is preferably less than about 1,000,000 square Angstroms, is more preferably less than about 250,000 square Angstroms and is, most preferably, less than about 90,000 square Angstroms.

It is noted that in the embodiments shown in FIGS. 20A and 20B, the bottom surface 151B of the memory material sidewall layer 151 is in the form of a narrow strip extending across the length of the single cell 20 structure. However, in the spacer etch step of the process, i.e., step 74, an additional etch of the memory material layer 150 may occur whereby at least a portion of the memory material layer 150 is removed and filled with the fourth oxide layer 152 in step 76. This results in the memory material sidewall layer 151 extending only a portion of length of the structure shown in FIGS. 20A and 20B. Additional etching can, in fact, result in the memory material layer 150 forming a sidewall layer 151 as small as a hole or a pore. This is particularly useful in the alternate embodiments of FIGS. 20A and 20B respectively shown as FIGS. 21A and 21B.

FIGS. 21A and 21B result from certain changes to the process steps of FIG. 4. Specifically, if the etch of step 60 is skipped, the entire conductive layer 130 shown in FIG. 8 remains throughout the subsequent processing steps. This results in two contact areas of the memory material sidewall layer 151 to the conductive region 134. Since a goal of the simplified process described herein is to minimize the contact area between these two materials, this would be an undesirable result. As seen in FIGS. 21A and 21B, removal of portions of the memory material layer 150 when forming the sidewall layer 151 of memory material also results in one small contact area A as previously described. After the additional etch(es) in step 74, the fourth oxide layer 152 is deposited in step 76 as previously described, the CMP step 76 similarly occurs as described.

Regardless of whether this variation in the process occurs or not, steps 80-84 of FIG. 4 can take place. Deposited on top of the structure resulting from steps 50-78 is a second conductive layer 156 forming a second electrode. FIG. 22 shows a cross-section of the structure of FIG. 20A in the direction indicated along the line 154-154 after the deposit of the second conductive layer 156 in step 80. This second conductive layer 156 can comprise the same material as the first conductive layer 130 and be deposited according to the techniques previously discussed. In step 82, a standard photo and etch step of the second electrode 156 results in a plurality of conductive wordlines 22, which extend perpendicular in direction to the conductive bitlines 24 shown in FIG. 5. One of the wordlines 22 formed from the second electrode 156 is shown in FIG. 23. The simplified process ends at step 84.

While the second electrode 156 forms the conductive wordlines 22 in the embodiment shown, this is not necessary. The second electrode 156 can be formed of a contact material, such as that used for the contact layer 122, shown in FIG. 5, with or without an insulation layer. Then, the conductive wordlines 22 can be formed of, for example, aluminum conductors 22 extending perpendicular in direction to the bitlines 24. In this description, the wafer 100 incorporates the conductive bitlines 24 as the diodes 32 are connected to the conductive bitlines 24. However, if the connections of the diode 32 and the memory element 30 were to be reversed, the wafer 100 would incorporate the conductive wordlines 22 and the second electrode 156 could form the conductive bitlines 24 in the manner described.

Although not shown, a top encapsulating layer of a suitable encapsulant such as $Si_3N_4$ or a plastic material such as polyimide/polyamide is typically added to the cell 20 to seal the structure against moisture and other external elements that could cause deterioration and degradation of performance. The encapsulant can be deposited, for example, using a low temperature plasma deposition process. The polyimide/polyamide material can be spin deposited and baked after deposition in accordance with known techniques to form the encapsulant layer. Also, although it is not shown in the exemplary single cell 20, when the cell 20 is incorporated in an array 14, the control lines 18 to a signal supply, such as the periphery circuitry 16, are typically included in the layout on the substrate 100 according to known techniques to contact wordlines 22 and bitlines 24.

The description herein is directed to the memory cell 20 shown in FIG. 3, which includes an inventive memory element 30 and an address device 32 associated with each memory element 30. The memory element 30 can also be constructed separate from the address device 32 upon the substrate 100 given the teachings herein and the level of skill in the art. The memory element 30 can be optionally combined with an address device 32 formed upon the substrate 100 or another wafer to form a memory cell 20. The memory element 30 formed separate from an address device 32 still include the conductive sidewall region 134 and the memory material sidewall layer 151 embedded in their dielectric regions. The memory element 30 would also include some type of first contact, such as contact 122, embedded in an insulating layer in the substrate 100 and connectable to a signal supply. Preferably, the memory element 30 would also include a second contact such as that formed from the second conductive layer 156. Then, both contacts are connectable to the signal supply, such as a DC voltage supply (not shown).

Finally it is noted that additional layers may be included in the structure described. For example, additional dielectric layers may be added to optimize the processing and especially the etching steps described. Other layers may be added for insulation and barrier protection. A particularly good example of the use of additional layers is the inclusion of barrier protection between the conductive region 134 and the memory material sidewall layer 151. As mentioned at the beginning of the description, an electrode of a memory element 30 need not be in physical contact with the phase-change memory material; electrical communication is sufficient. A barrier layer of a suitable material can both improve the electrical communication between the surfaces 134T and 151B and improve the physical connection between them. It this clear then, that the area of contact A as previously described need not be an area where the conductive region 134 and the memory material sidewall layer 151 directly contact one another.

It is noted that electrode structures for programmable resistance memory elements are found in U.S. patent application Ser. No. 09/276,273, the disclosure of which is incorporated by reference herein.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims

I claim:

1. An electronic device comprising:
   a first layer, said first layer comprising:
      a first dielectric material, said first dielectric material having a first planar surface;
      a second dielectric material, said second dielectric material having a second planar surface;
      a first conductive material in contact with said first dielectric material and said second dielectric material, said first conductive material having a third planar surface, said first layer having a first composite planar surface, said first composite planar surface including said first planar surface, said second planar surface, and said third planar surface; and
   a second layer, said second layer comprising:
      a third dielectric material, said third dielectric material having a fourth planar surface;
      a fourth dielectric material, said fourth dielectric material having a fifth planar surface;
      a programmable resistance material in contact with said third dielectric material and said fourth dielectric material, said programmable resistance material having a sixth planar surface, said second layer having a second composite planar surface in contact with said first composite planar surface, said second composite planar surface including said fourth planar surface, said fifth planar surface, and said sixth planar surface.

2. The device of claim 1, wherein the composition of said first dielectric material differs from the composition of said second dielectric material.

3. The device of claim 1, wherein said first conductive material comprises a metal.

4. The device of claim 1, wherein the width of said third planar surface is less than 1000 Angstroms.

5. The device of claim 1, wherein the width of said third planar surface is less than 500 Angstroms.

6. The device of claim 1, wherein the width of said third planar surface is less than 300 Angstroms.

7. The device of claim 1, wherein the composition of said third dielectric material differs from the composition of said fourth dielectric material.

8. The device of claim 1, wherein said programmable resistance material comprises a phase-change material.

9. The device of claim 1, wherein said programmable resistance material comprises a chalcogen element.

10. The device of claim 1, wherein the width of said sixth planar surface is less than 1000 Angstroms.

11. The device of claim 1, wherein the width of said sixth planar surface is less than 500 Angstroms.

12. The device of claim 1, wherein the width of said sixth planar surface is less than 300 Angstroms.

13. The device of claim 1, wherein the width of said third planar surface is greater than the width of said sixth planar surface.

14. The device of claim 1, wherein said third planar surface contacts said first planar surface.

15. The device of claim 14, wherein said third planar surface contacts said second planar surface.

16. The device of claim 1, wherein said sixth planar surface contacts said fourth planar surface.

17. The device of claim 16, wherein said sixth planar surface contacts said fifth planar surface.

18. The device of claim 1, wherein said third planar surface contacts said sixth planar surface.

19. The device of claim 18, wherein the area of contact of said third planar surface and said sixth planar surface is less than 1,000,000 square Angstroms.

20. The device of claim 18, wherein the area of contact of said third planar surface and said sixth planar surface is less than 250,000 square Angstroms.

21. The device of claim 18, wherein the area of contact of said third planar surface and said sixth planar surface is less than 90,000 square Angstroms.

22. The device of claim 18, wherein said third planar surface contacts said fourth planar surface.

23. The device of claim 22, wherein said third planar surface contacts said fifth planar surface.

24. The device of claim 18, wherein said sixth planar surface contacts said first planar surface.

25. The device of claim 24, wherein said sixth planar surface contacts said second planar surface.

26. The device of claim 25, wherein said third planar surface contacts said fourth planar surface.

27. The device of claim 26, wherein said third planar surface contacts said fifth planar surface.

* * * * *